United States Patent
English

Patent Number: 5,491,451
Date of Patent: Feb. 13, 1996

[54] METHOD AND APPARATUS FOR REDUCTION OF ATOMIC FREQUENCY STANDARD PHASE NOISE

[75] Inventor: Thomas C. English, Costa Mesa, Calif.

[73] Assignee: Ball Corporation, Muncie, Ind.

[21] Appl. No.: 341,372

[22] Filed: Nov. 17, 1994

[51] Int. Cl.$^6$ ............................................. H03L 7/26
[52] U.S. Cl. ................................. 331/3; 331/94.1
[58] Field of Search ............................ 331/3, 94.1

[56] References Cited

U.S. PATENT DOCUMENTS

| | | |
|---|---|---|
| 4,122,408 | 10/1978 | Walls ............................ 331/3 |
| 4,405,905 | 9/1983 | Busca et al. .................. 331/3 |
| 4,947,137 | 8/1990 | Busca et al. ............... 331/94.1 |
| 4,968,908 | 11/1990 | Walls ........................ 307/529 |
| 5,101,506 | 3/1992 | Walls ........................ 455/115 |
| 5,172,064 | 12/1992 | Walls ........................ 324/601 |

*Primary Examiner*—Siegfried H. Grimm
*Attorney, Agent, or Firm*—Willian Brinks Hofer Gilson & Lione

[57] ABSTRACT

A method of reducing the interrogation signal phase noise in passive, compact, low-cost commercial atomic standards, particularly phase noise occurring at a Fourier frequency equal to twice the modulation frequency, $2f_{mod}$. The method involves selecting the modulation frequency so that $2f_{mod}$ is on the order of, or greater than, the atomic bandwidth (full width at half maximum signal value).

17 Claims, 2 Drawing Sheets

METHOD AND APPARATUS FOR REDUCTION OF ATOMIC FREQUENCY STANDARD PHASE NOISE

FIELD OF THE INVENTION

The present invention relates to frequency standards and particularly to atomic frequency standards wherein the frequency of an oscillator is electronically locked to a transition frequency of a particular element, such as rubidium, cesium, or hydrogen. More particularly, the invention relates to methods and apparatus for reducing phase noise associated with modulation signals applied to the physics package of an atomic frequency standard.

BACKGROUND OF THE INVENTION

An atomic frequency standard is a device having a resonant system derived from an atomic or molecular specie experiencing a transition between two or more well-defined energy levels of the atom or molecule.

For example, the two lowest energy levels of the rubidium atom (Rb) are known as the ground state hyperfine energy levels A and B. When atoms of gaseous Rb-87 at levels A and B are interrogated (irradiated) with microwave energy at a precise "transition frequency", corresponding to the rubidium frequency representing atom transitions between the hyperfine energy levels, the rubidium atoms at hyperfine energy level A will make the transition to level B, and vice versa. The transition is employed as a highly accurate frequency reference to which the frequency of a frequency controllable oscillator, such as a voltage-controlled crystal oscillator (VCXO), can be electronically locked in creating an atomic frequency standard.

In such atomic-controlled oscillators the frequency of a quartz crystal oscillator is controlled by means of a physics package and associated electronics that are devoted to maintaining the assigned output frequency, typically 5 MHz or 10 MHz, on a very long-term, exceedingly accurate and stable basis. By properly slaving a quartz crystal oscillator to the frequency of the atomic transition in the physics package, the tendency of the quartz crystal to exhibit drifting due to aging and other inherent as well as environmental effects is markedly suppressed. The physics package of a typical atomic frequency standard generally includes a microwave cavity resonator, an isotopic filter cell, an absorption cell, a light source, a photo detector, temperature control means, at least one magnetic shield surrounding these components, and a C-field coil.

In the physics package of a typical rubidium atomic frequency standard 10, as for example shown diagrammatically in FIG. 1, a light source 11 includes a glass bulb containing rubidium atoms which produces light by an rf-excited plasma discharge. The rubidium in the lamp 11 is heated to a vapor state, approximately 110° C., and is subjected to a high-energy rf field, thereby generating light from the excited rubidium atoms. The "rubidium light" is directed through a filter cell 25a which contains an isotope of rubidium, such as Rb-85, which filters out light with a wavelength that will stimulate transition of atoms from the hyperfine energy level B to any optically-excited level C. The filtered rubidium light is then directed through an absorption cell 25, also called a resonance cell. The absorption cell 25 includes another isotope of rubidium, Rb-87, and the filtered light energy absorbed by the Rb-87 atoms at hyperfine energy level A causes a transition of the Rb-87 atoms from level A to an optically-excited energy level C. The atoms excited to energy level C, however, do not remain at level C for more than tens of nanoseconds, but return to ground state hyperfine levels A and B in approximately equal numbers by either spontaneous emission of light and/or by collisions, including collisions with other atoms, molecules, or the walls of the absorption cell 25. Since the filtered light does not allow transitions of atoms from level B to level C, the continuing cycle of optical excitation of atoms from level A to level C and the redistribution of atoms falling from level C between levels A and B eventually results in few, if any, atoms at level A for excitation to level C, and little or no absorption of the light passing through the absorption cell 25 because the atoms have accumulated at hyperfine energy level B. The atoms at level A are said to have been "optically pumped" level B. If, however, microwave energy is applied to the absorption cell 25 at the rubidium transition frequency, transitions of atoms between hyperfine levels A and B occur, re-introducing atoms at level A which again absorb light energy and undergo a subsequent transition to level C and thereby reduce the light passing through the absorption cell 25.

The rubidium light passing through the absorption cell 25 is incident on a photo detector 16, which produces a current output which is proportional to the intensity of the incident light. The current output is processed to provide a control voltage to a voltage controlled crystal oscillator 27 (VCXO) (not shown in FIG. 1) whose output is multiplied and synthesized to the rubidium transition frequency and provides the microwave energy used to cause the transitions between hyperfine levels A and B. When the frequency of the microwave energy corresponds to the hyperfine transition frequency, 6.834 GHz for Rb-87, maximum light absorption occurs and the current output of the photo detector 16 is reduced. If, however, the frequency of the microwave energy does not correspond to the hyperfine frequency, then more light will pass through the absorption cell 25 to the photo detector 16, which in turn increases its current output. Thus, as shown in FIG. 1, the light intensity at the photodetector 16 is at a minimum when the microwave energy from the VCXO 27 is at the hyperfine frequency.

During the last several years attention within the time and frequency community has been directed to efforts to develop frequency sources having exceptionally high short-term frequency stability for use as "flywheels" for the next generation of ultra-long-term stable frequency standards, such as ion storage standards. One of the limitations to improving short-term stability (STS) in passive atomic frequency standards is the phase noise in the frequency source that interrogates the atoms.

All passive atomic frequency standards use modulation methods to lock the interrogation frequency to the more stable atomic reference frequency. Of special concern with the use of a frequency modulated interrogation signal is the phase noise of the interrogating signal that occurs at a Fourier frequency (offset from the carrier frequency) equal to two times the modulation frequency ($2f_{mod}$).

The interrogating signal, including modulation, can be represented by a carrier at the interrogating frequency (which is nominally equal to the frequency of the atomic resonance) plus sidebands of various amplitudes spaced at intervals equal to the modulation frequency. The carrier plus sidebands act as a stimulus for the atoms that provide the frequency reference for the standard. The atoms and the physics package of the standard provide a response to this stimulus in the form of a modulated signal that is processed by an electronic servo system of the atomic standard to slave the VCXO frequency to the resonance frequency of the atoms. The strength of the output signal of the physics package depends on how strong the atom response is to the stimulus which is based, at least in part, on the positions of the carrier and sidebands within the atomic bandwith (ABW). In assessing this effect, the carrier and each sideband must be considered individually, according to the superposition principle.

The physics package output signal results from a mixing effect whereby the various sidebands and the carrier, each suitably modified by the atomic response, beat against each other in the photodetector producing various sum and difference frequencies. The sum frequencies are not of interest and can be ignored. The difference frequencies are equal to the modulation frequency and the harmonics of the modulation frequency.

It is well known that a second harmonic component in the modulating frequency produces an unwanted signal at the physics package output at the modulation frequency. The electronic servo system cannot distinguish this "pseudo" error signal from a true error signal and therefore produces an offset in the output frequency of the standard in order to null this signal at the input of the servo integrator. Thus, second harmonic contamination in the modulating signal produces an offset in the standard's output frequency. Likewise, the presence of phase noise at $2f_{mod}$ in the interrogating signal causes the physics package to produce an output noise component at frequency $f_{mod}$; in effect, the physics package acts as a phase noise-to-amplitude noise convertor with down conversion from $2f_{mod}$ to $f_{mod}$. The $f_{mod}$ noise component is demodulated by the servo to produce low frequency phase noise on the standard's output. This low frequency phase noise degrades the standard's STS.

Phase noise of a frequency modulated interrogating signal can thus be important in limiting the STS of a compact commercial atomic frequency standard. If a poor quality VCXO is used to generate the interrogation signal in an atomic frequency standard, the phase noise and associated sidebands may limit the STS to higher than normal values. Alternatively, if the desired STS goal is lower than normal, the phase noise may be limiting, even with a good VCXO.

Even when a good VCXO is used, the method of generating the interrogating signal may introduce additional phase noise that limits the STS. For example, in a rubidium frequency standard, this would include the use of a multiplier chain consisting of a 360 MHz VCO that is phase locked to a 10 MHz VCXO, with the output of the 360 MHz VCO multiplied to 6840 MHz by a step recovery diode (SRD). Even though the VCXO has relatively low phase noise, the free running VCO does not. Tight phase lock of the VCO is desirable in this scheme to reduce the VCO phase noise by slaving it to the lower-phase-noise VCXO. If the lock is not tight enough, the "residual" phase noise of the VCO may affect the STS of the standard.

Audoin and coworkers have developed a theory to account for such phase noise using quasi-static modulation theory. See *A Limit to the Frequency Stability of Passive Frequency Standards Due to an Intermodulation Effect*, IEEE Trans. Instr. Meas. 40, 121 (1991). Unfortunately, this theory is valid only in the limit where the modulation frequency is significantly smaller than the atomic linewidth (bandwidth), namely, $f_{mod}$<<ABW, where ABW=atomic bandwidth=full width at half maximum signal of the atomic line.

Experimental tests of the theory have been conducted. Walls and coworkers have demonstrated a method for improving STS by using a dual crystal notch filter to remove phase noise at $\pm 2f_{mod}$ from the interrogation frequency. See *Reducing Local Oscillator Phase Noise Limitations on the Frequency Stability of Passive Frequency Standards Tests of a New Concept*, IEEE Trans. Ultrasonics, Ferroelectrics & Freq. Control 41, 518 (1994). However, the dual crystal filter method of reducing interrogation phase noise is complex and costly and therefore, is not practical in passive, compact, low-cost commercial atomic standards.

Notwithstanding the limited validity of the quasi-static modulation theory, it appears that all of the work done to date on phase noise reduction operates within the quasi-static paradigm where the modulation frequency is kept small compared to the atomic bandwidth (ABW) as illustrated in FIG. 3. By way of example, a passive, gas-cell rubidium standard has an atomic bandwidth of 700–1000 Hz, depending on various factors, including the strength of the interrogating signal, and conventional modulation frequencies are on the order of 100–130 Hz.

A need exists for a simple and economical method of reducing interrogation signal phase noise in passive, compact, low-cost commercial atomic standards, particularly phase noise occurring at a Fourier frequency equal to twice the modulation frequency, $2f_{mod}$.

SUMMARY OF THE INVENTION

In the invention, the effect of the $2f_{mod}$ phase noise of the interrogating signal is reduced by increasing the modulation frequency so that $2f_{mod}$ is on the order of, or greater than, the ABW (full width at half maximum signal value). This method of reducing the effect of the $2f_{mod}$ phase noise lies outside the validity of the quasi-static theory.

In the invention, the atomic response to the phase noise in the interrogating signal at $2f_{mod}$ is reduced by selecting $f_{mod}$ to be on the order of, or greater than, the half ABW (FIG. 4). In the invention, phase noise at $2f_{mod}$ from the carrier is located near the edge or outside the ABW so that the atoms' response to it is significantly reduced as compared to the quasi-static case where $2f_{mod}$ is well within the ABW (FIG. 3). The invention reduces the conversion efficiency of the physics package for converting phase noise at $2f_{mod}$ from the carrier into amplitude noise at $f_{mod}$ and results in less degradation of the standard's STS.

According to the present invention, a passive atomic frequency standard comprises first means for generating atomic transitions of an atomic element having a known frequency bandwidth (atomic linewidth) of transition, second means for generating a standard frequency output, and third means for controlling the second means. The third means includes fourth means for generating an interrogation signal input to the first means from the standard frequency output of the second means. The fourth means generates the interrogation signal with frequency modulation at least on the order of the frequency half bandwidth of transition of said atomic element. The third means also includes fifth means for generating a frequency correction signal input to said second means to stabilize the standard frequency output. Preferably, the second means is a voltage controlled crystal oscillator and the fourth means includes a synthesizer and a modulation frequency generator that provides a modulating signal whose fundamental frequency is at least on the order of, but greater than, the frequency half bandwidth of transition of the atomic element.

The modulation type used in the invention can vary with the particular application. In one embodiment of the invention, the modulation is a sinusoidal modulation. In another embodiment, the modulation is a square wave modulation. In yet another embodiment, the modulation is a sawtooth modulation for which all the even harmonics are zero.

The invention also includes a method for slaving the output of a frequency standard to the frequency of transition of an ensemble of atoms. The method comprises the steps of providing both an ensemble of atoms having an atomic transition frequency and a frequency standard having an output signal, converting the output signal into a frequency modulated interrogation signal for injection into the ensemble of atoms, and providing means for controlling the output signal based on a frequency difference between the frequency modulated interrogation signal and the atomic transition frequency, whereby the interrogation signal is modulated with a frequency at least on the order of the frequency half bandwidth.

Additional objects, features and advantages of the invention will become apparent to those skilled in the art upon consideration of the following detailed description of a preferred embodiment exemplifying the best mode of carrying out the invention as presently perceived.

DETAILED DESCRIPTION OF THE DRAWINGS

Figure 1:
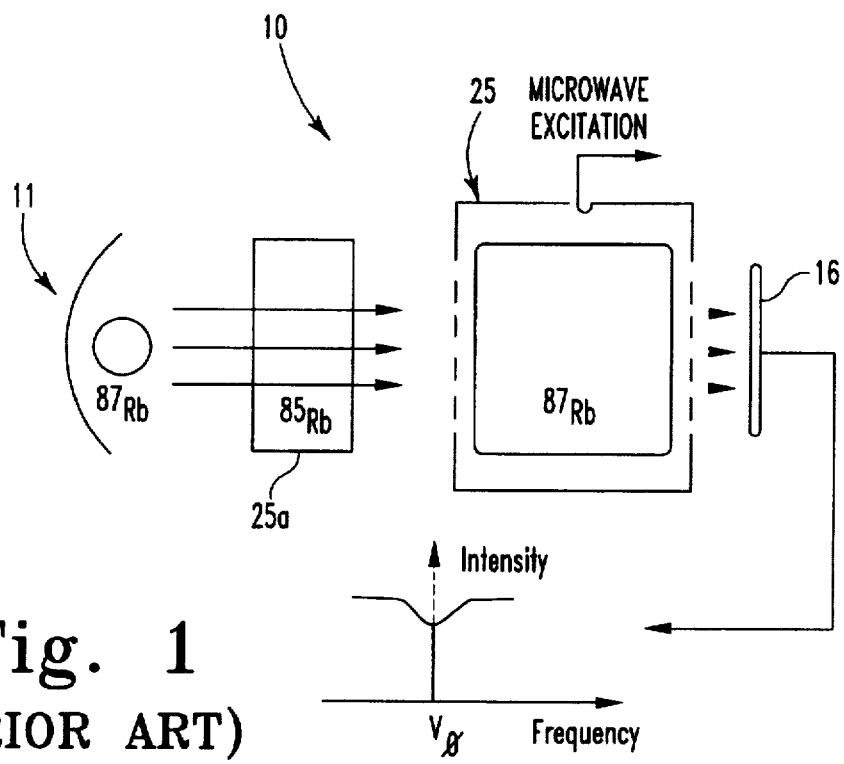
FIG. 1 is a diagrammatic representation of an optical physics package.
Figure 2:
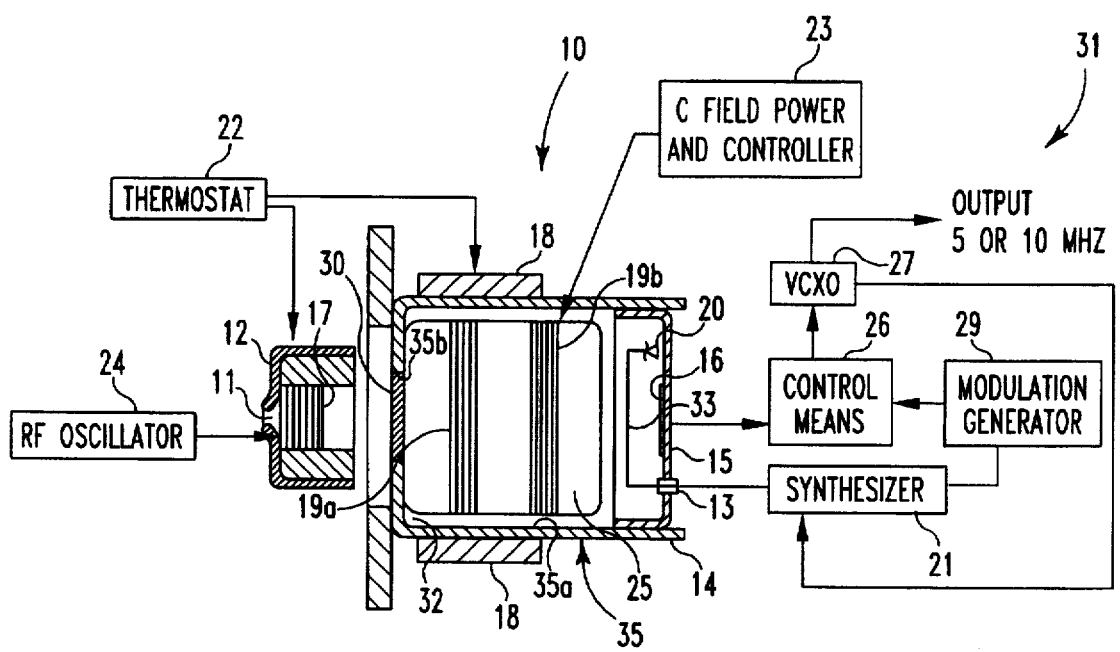
FIG. 2 is a diagrammatic representation of a rubidium atomic frequency standard.

In one exemplary embodiment of an atomic frequency standard that may include the present invention, optical-physics package 10 provides first means for generating atomic transitions of rubidium. As illustrated in FIG. 2, which is directed to an embodiment using one of the alkali metals, viz., rubidium, an electrodeless gas discharge lamp 11, which is evacuated and filled with rubidium, plus a suitable buffer gas at a pressure, generally about 2 torr (0.27 kPa), is surrounded by an exciter coil 17, said coil 17 being activated by a radio-frequency oscillator 24. The lamp 11 within a lamp housing 12 of the optical-physics package 10 is arranged with a thermostat 22 which renders a controllable temperature, usually about 110° C., which is required for generating the requisite rubidium vapor pressure in the lamp 11. As can be appreciated, the thermostat 22 keeps the temperature of the liquid rubidium metal constant within narrow limits, as the light emitted by the lamp 11 is dependent on variations in the rubidium vapor pressure and, hence, on this temperature.

The light radiated from the lamp 11 arrives at a photodetector 16 after transversing an absorption cell 25 positioned between lamp 11 and photodetector 16. The absorption cell 25 comprises an evacuated cylindrical glass bulb which is likewise filled with vaporized rubidium having a suitable vapor pressure and with a buffer gas, such as nitrogen or argon, or some mixture of such buffer gases.

In the particular embodiment of the optical-physics package 10 shown herein, it should be observed that no separate filter cell is employed as is often conventional in such devices, but instead an absorption cell 25 of special design as that described in U.S. Pat. No. 3,798,565 to Ernest Jechart is contemplated. Thus, the absorption cell 25 is one containing an ensemble of atoms forming an isotopic mixture and, more particularly, a mixture of Rb85 and Rb87 atoms in accordance with the teaching of U.S. Pat. No. 3,903,481, also to Jechart. When the Rb87 in the lamp 11 is excited it emits light having a spectrum containing the two strong optical lines of Rb87 ($D_1$ at 794.8 nm and $D_2$ at 780.0 nm) each of which, in turn, contains two main hyperfine components. A beam of such light transversing the absorption cell 25 containing the buffer gas as well as the mixture of Rb85 and Rb87 isotopes causes the preferential absorption of one of the hyperfine components for both $D_1$ and $D_2$ lines. The remaining $D_1$ and $D_2$ spectral component serves as optical pumping light and brings about a population inversion between the two ground state hyperfine levels of Rb87 in the absorption cell 25. Preferentially, only those atoms that are in the lower hyperfine state absorb the optical pumping light and are raised into optically-excited high-energy states.

Furthermore, by spontaneous emission and collisions, such atoms return to one of the ground hyperfine states. As the number of atoms able to absorb the optical pumping light decreases, the absorption cell 25 tends to become transparent. Upon introduction of microwave radiation by means for generating such radiation 31 within a microwave cavity 35 resonant at a frequency of 6.834 . . . GHz, the frequency corresponding to the energy gap between the two ground state hyperfine levels, there is produced a population increase of atoms in the lower hyperfine level. This results in an increase in light absorption. The atoms that arrive in this lower state are, of course, optically pumped and raised to higher energy states. As the atoms drop into the lower ground state hyperfine level from the upper ground state hyperfine levels, a correspondingly smaller amount of light reaches the photodetector 16 since light is being actively absorbed by Rb87. When there is less light reaching the photodetector 16 there is a corresponding reduction in the photocurrent produced by the photodetector 16. This decrease in light, when the microwave frequency is equal to the very-sharply-defined rubidium frequency, is then converted electronically to an error signal with amplitude and phase information that is used to steer the VCXO 27 via its control voltage to keep it at a frequency of 10 MHz. Upon this occurrence, VCXO 27 is frequency locked to the stable atomic transition frequency. Thus, by use of the above described scheme, the VCXO 27 provides second means for generating a standard frequency output that is exactly 10 MHz when the microwave frequency is exactly equal to the frequency of the rubidium transition.

It is to be noted that the photodetector 16 and absorption cell 25 are fully enclosed within the microwave resonator cavity 35 which is of cylindrical design and includes a cylindrical body 14 having a light-permeable dielectric window 30 therein and a lid 15 integrally connected to said body 14 to thereby fully seal the same. In accordance with this invention, it has been found most advantageous that the resonator cavity 35 be constructed of a material having high magnetic permeability in low magnetic fields. It can be seen that the resonator cavity 35 is closed to the outer air and thus may, when connected to a heater ring 18, be advantageously controlled to maintain by heat control means 22, a constant temperature, e.g. 75° C. In one embodiment, the material of the resonator cavity 35 may comprise a nickel-steel alloy containing about 17 to about 20 percent iron, about 5 percent copper and low percentages of manganese or chromium. In general, however, any of a host of ferromagnetic compositions or materials capable of rendering equivalent magnetic-permeable properties such as metals or alloys of high magnetic permeability may serve as the resonator cavity 35 as long as such permeability is at least equal to if not significantly greater than that of pure iron with or without additional constituents, such as cobalt and chromium. Such metals, as known, provide effective shielding from the earth's magnetic field and from any other magnetic field or fields which might cause interference in order to achieve the desired precise control of the resonant frequency of operation. The resonator cavity 35 is generally silver plated, or copper plated at first and thereafter silver plated.

A current supplied to the windings 19 cause a magnetic field known as a "C-field" to be established. A number of C-field windings 19 are made around the inside wall of the microwave resonator cavity 35 and, hence, around the absorption cell 25. Thus, the windings 19 are disposed inside the resonator cavity 35 for producing by means of a C-field power and controller 23 a magnetic field of a predetermined intensity. Generally, this could vary over a wide range but is usually between about 0 to about 1 gauss. Although any number of wound sections may be used, two separately energizable sections may be readily utilized as shown, 19a and 19b. One of the functions of the C-field windings 19 is to create in operation a magnetic bias field in the microwave resonator cavity 35 and, therefore, within the absorption cell 25. The coils 19a and 19b may be wound around the outside of the absorption cell 25 and any separation or space 32 between the absorption cell 25 and said cavity resonator 35 may be readily filled with a non-magnetic polymer material such as polymeric silicone elastomers including room temperature-vulcanizing silicone rubber compounds, organosiloxane polymers and the like. Generally, the windings 19 consist of a single layer of turns of insulated copper wire. The C-field windings 19 are placed in an appropriate position to create in the present embodiment a predetermined inhomogeneous magnetic field not exceeding approximately one gauss to bias magnetically the absorption cell 25 and thereby to separate the Zeeman levels of each hyperfine state of the vapor atoms. Connected through the wall of lid 15 is a microwave input means comprising a feed-through capacitor 13 coupled to a step recovery diode 20 by means of a conductor 33. By such input means microwave energy is rendered to the interior of the resonator cavity 35 to provide microwave coupling thereto.

The atomic frequency standard 10 includes third means for controlling the VCXO 27, which includes fourth means for using the output of the VCXO 27 and generating an interrogation signal to be input to the absorption cell 25. For example, the microwave cavity resonator 35 is excited with microwave energy at the atomic resonance frequency of the atomic vapor within the absorption cell 25 and in the case of rubidium at a frequency of 6.834 . . . GHz. In practice, this signal is derived from the 10 MHz VCXO 27 by means of a frequency synthesizer and modulator 21. Thus, the microwave energy applied to the cavity resonator 35 is frequency modulated.

In prior art atomic frequency standards, the modulation frequency is very much smaller than the atomic bandwidth, e.g. less than 150 Hz in prior art rubidium standards. With this invention, the modulation frequency is at least on the order of the atomic half bandwidth, e.g., generally at least about 350 to 500 Hz or greater.

The output of the synthesizer 21, which is generally about 60 MHz plus an additional signal of 5.3125 MHz, is applied to a microwave generating means including the feed-through capacitor 13, the step recovery diode 20 and the length of the conductor 33. As is known, the step recovery diode 20 functions as a harmonic generator and mixer producing an output signal that contains multiple harmonics of the input signal, the one hundred fourteenth harmonic of the input 60 MHz frequency being 6.84 GHz. Additionally, the diode 20 functions as a mixer to render microwave energy at a frequency of 6834.6875 MHz (6840.0000 MHz −5.3125 MHz), the frequency of Rb87 in accordance with the preferred embodiment. As already discussed, the injection of electromagnetic energy at this frequency interacts with the rubidium absorption cell 25 to produce a detectable partial reversal of the optical pumping process.

The third means also includes fifth means for generating a frequency correction signal input to the VCXO 27 to stabilize the output of the VCXO 27. Accordingly, an error signal is generated to control VCXO 27 by the following scheme. The ac signal from the photodetector 16 is coupled to an amplifier located at a station 26 and the amplified signal is applied to a synchronous demodulator at station 26 which also receives a signal from a modulation generator 29. By this means it can be determined if the carrier frequency of the signal applied to the resonator cavity 35 is properly centered on the frequency of the hyperfine transition 6.834 . . . GHz. Any deviation or displacement results in an error signal at the output of the demodulator at station 26. This signal is used to control the VCXO 27 which may be modified so as to maintain the frequency of the synthesized microwave signal at 6.834 . . . GHz centered on the frequency of the hyperfine transition of rubidium.

As previously noted, in conventional frequency standards, the actual response to the 6.834 GHz microwave signal can be somewhat different from the response predicted from the quasi-static model. Specifically, the various modulation sidebands and the interrogation signal beat against each other in the photodetector and produce difference frequencies equal to the modulation frequency and the harmonics of the modulation frequency.

Figure 3:
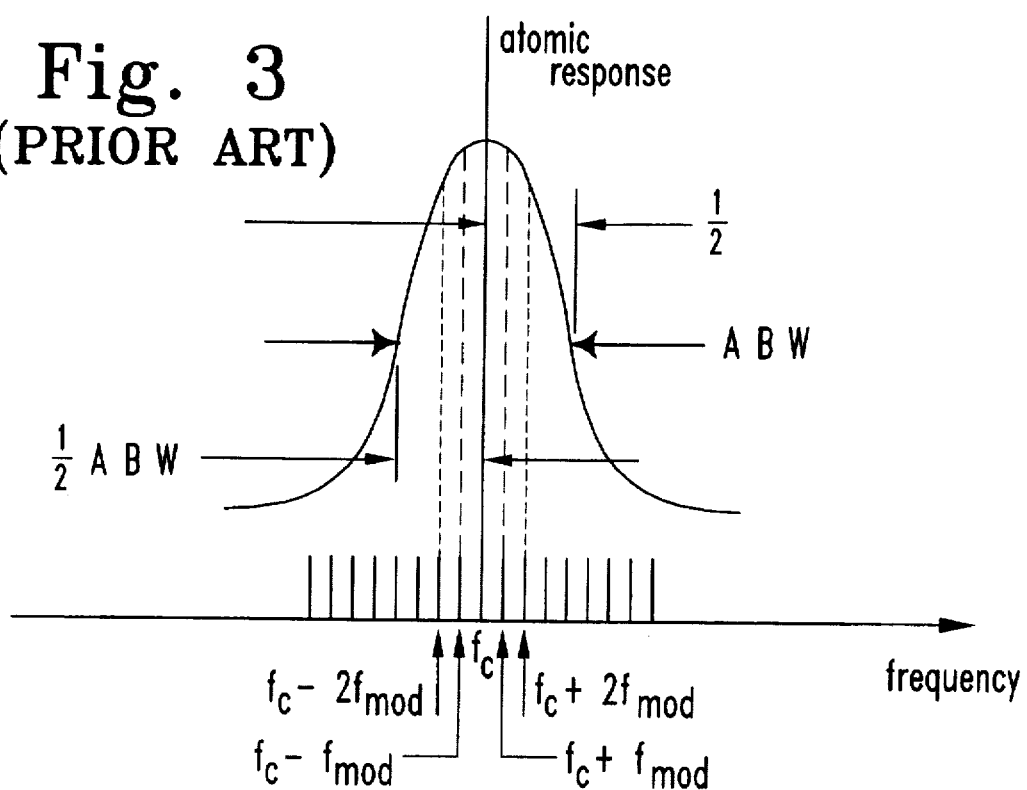
FIG. 3 illustrates the relationship between the atomic bandwidth of an atomic frequency standard and the location of the FM sidebands using conventional modulation.

With a conventional modulating signal, having a frequency typically on the order of 100–130 Hz, several sidebands of the interrogation signal fall within the ABW of the transition frequency of the absorption cell 25, as shown illustratively in FIG. 3. Accordingly, the microwave carrier and sidebands act as stimuli for the atoms in the absorption cell 25. The atoms provide a response to the stimuli in the form of a modulated signal that is processed by the control means 26 to servo the VCXO 27 frequency to the transition frequency of the ensemble of atoms in the absorption cell 25. In the conventional approach (FIG. 3), where the frequency of the modulating signal is small compared to the ABW, the microwave sidebands at $\pm 2f_{mod}$ from the carrier fall well within the ABW of the atomic resonance. As a result, the atoms provide a strong response to these two sidebands, and also to the phase noise in these sidebands. As discussed previously, in this case the physics package acts as a phase-noise-to-amplitude down convertor, producing output amplitude noise at the modulation frequency. This amplitude noise, which cannot be distinguished from amplitude noise due to other effects (e.g., photocurrent shot noise), passes through the demodulator and is applied to the voltage control input of the VCXO 27 where it produces frequency noise on the output of the VCXO. If the $\pm 2f_{mod}$ phase noise in the interrogating signal is sufficiently large, the corresponding VCXO frequency noise can be large enough to seriously degrade the STS of the standard.

Figure 4:
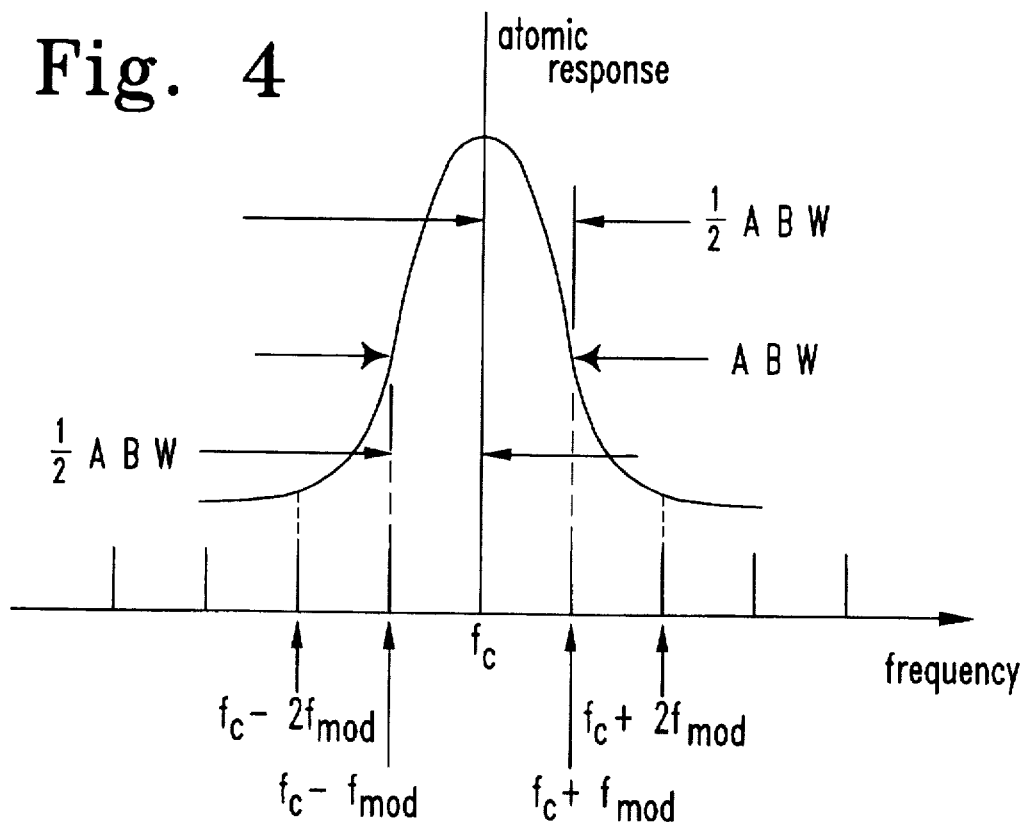
FIG. 4 illustrates the relationship between the atomic bandwidth of an atomic frequency standard and the location of the FM sidebands for the invention set forth here (only the positions of the sidebands, and not their amplitudes, are indicated in FIGS. 3 and 4).

When the modulating signal is on the order of 350 to 500 Hz, however, as in the case of the present invention, the microwave sidebands at $\pm 2f_{mod}$ from the carrier are pushed well out of the ABW of the transition frequency and out of the region of strong atomic response, as shown illustratively in FIG. 4. Accordingly, the atomic response to phase noise at $\pm 2f_{mod}$ from the carrier is greatly reduced. This results in a reduction of amplitude noise out of the physics package at the modulation frequency. Consequently, the effect of the $\pm 2f_{mod}$ phase noise on the STS of the standard is greatly reduced.

Although the invention has been described in detail with reference to a certain preferred embodiment, variations and modifications exist within the scope and spirit of the invention as described and defined in the following claims.

I claim:

1. A passive atomic frequency standard, comprising first means for generating atomic transitions of an atomic element, having a known frequency bandwidth (atomic linewidth) of transition, second means for generating a standard frequency output, and third means for controlling said second means, from an output of said first means, said third means comprising fourth means for generating an interrogation signal input to said first means from the standard frequency output of said second means, and fifth means, connected with said first means, for generating a frequency correction signal input to said second means to stabilize said standard frequency output, said fourth means generating said interrogation signal with frequency modulation whose fundamental modulation frequency is on the order of half the frequency bandwidth of transition of said atomic element.

2. The passive atomic frequency standard of claim 1 wherein said second means is a voltage controlled crystal oscillator, and said fourth means includes a synthesizer and a modulation frequency generator.

3. A method for providing an atomic frequency standard, the method comprising the steps of:

providing a physics package having an atomic transition frequency with an atomic bandwidth, providing a frequency standard having an output signal, converting the output signal to provide an interrogation signal, generating an error signal based on a frequency difference between the interrogation signal and the atomic transition frequency of the physics package, and using the error signal to reduce the frequency difference, wherein the converting step includes the step of providing modulation of the interrogation signal such that the modulation frequency is at least on the order of half the atomic bandwidth.

4. The method of claim 3 wherein the step of providing modulation includes the step of modulating the interrogation signal with a sinusoidal frequency modulation.

5. The method of claim 3 wherein the step of providing modulation includes the step of frequency modulating the interrogation signal with a square wave frequency modulation.

6. The method of claim 3 wherein the step of providing modulation includes the step of phase modulating the interrogation signal with a sawtooth frequency modulation.

7. The method of claim 3 wherein the frequency of the modulating signal is greater than half the atomic bandwidth.

8. An atomic frequency standard including an absorption cell containing an ensemble of atoms having a resonance frequency and an atomic bandwidth, a light source for transmitting light toward the absorption cell, and a photodetector for detecting light passing through the absorption cell, the standard comprising:

means for providing an interrogation signal for injection into the absorption cell, and means for controlling the interrogation signal so as to reduce any frequency difference between the interrogation signal and the resonance frequency, wherein the providing means includes a modulation generator for producing a frequency modulation signal having a frequency at least on the order of half the atomic bandwidth of the ensemble of atoms.

9. The standard of claim 8 wherein the providing means includes a standard frequency generator having an output frequency signal, the interrogation signal is derived from the output signal and the signal from the modulation generator is used to modulate the interrogation signal.

10. The standard of claim 9 wherein the modulation signal modulates the interrogation signal with a sinusoidal modulation.

11. The standard of claim 9 wherein the modulation signal modulates the interrogation signal with a square wave modulation.

12. The standard of claim 9 wherein the modulation signal phase modulates the interrogation signal with a sawtooth modulation.

13. The standard of claim 9 wherein the modulation signal has a frequency greater than half the atomic bandwidth of the ensemble of atoms.

14. In an atomic frequency standard having a crystal oscillator generating an output signal, a modulation generator for modulating the output signal, an absorption cell containing an ensemble of atoms having a frequency of transition and an atomic bandwidth, a multiplier-synthesizer for converting the modulated output signal into an interrogation signal for injection into the absorption cell, a light source for transmitting light toward the absorption cell, a photodetector for providing a response to light passing through the absorption cell, and a control circuit using the photodetector response to generate an error signal to control the oscillator output signal, the improvement comprising:

a modulation generator for providing a modulating signal having a frequency at least on the order of half the atomic bandwidth.

15. The improvement of claim 14 wherein the modulating signal has a frequency greater than half the atomic bandwidth.

16. A method for slaving the output of a frequency standard to the frequency of transition of an ensemble of atoms, the method comprising the steps of:

providing an ensemble of atoms having a frequency of transition, providing a frequency standard having an output signal, converting the output signal into an interrogation signal for injection into the ensemble of atoms, and controlling the output signal based on a frequency difference between the interrogation signal and the frequency of transition,
wherein the frequency of transition includes a frequency bandwidth and the converting step includes the step of modulating the output signal with a frequency at least on the order of half the frequency bandwidth.

17. The method of claim 16 wherein the converting step includes the step of modulating the output signal with a frequency on the order of, but greater than, half the frequency bandwidth.

* * * * *

UNITED STATES PATENT AND TRADEMARK OFFICE
CERTIFICATE OF CORRECTION

PATENT NO. : 5,491,451

DATED : February 13, 1996

INVENTOR(S) : Thomas C. English

It is certified that error appears in the above-indentified patent and that said Letters Patent is hereby corrected as shown below:

In Col. 1, line 62, delete "any" and insert therefor --an--.

In Col. 2, line 15, before "level", insert --to--.

In Col. 4, line 4, after "Standards", insert --:-- (colon).

In Col. 8, line 31, delete "6.834 ... GHz" and insert therefor --6.834 GHz--.

Signed and Sealed this

Nineteenth Day of August, 1997

Attest:

BRUCE LEHMAN

*Attesting Officer*　　*Commissioner of Patents and Trademarks*